(12) United States Patent
Chen et al.

(10) Patent No.: US 12,713,875 B2
(45) Date of Patent: Aug. 18, 2026

(54) METHOD AND APPARATUS FOR WAFER BONDING

(71) Applicant: YANGTZE MEMORY TECHNOLOGIES CO., LTD., Wuhan (CN)

(72) Inventors: Guoliang Chen, Wuhan (CN); Mengyong Liu, Wuhan (CN); Yang Liu, Wuhan (CN); Wu Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 637 days.

(21) Appl. No.: 18/090,437

(22) Filed: Dec. 28, 2022

(65) Prior Publication Data

US 2023/0135060 A1 May 4, 2023

Related U.S. Application Data

(63) Continuation of application No. PCT/CN2021/126190, filed on Oct. 25, 2021.

(51) Int. Cl.
*H10W 46/00* (2026.01)
*H10P 72/00* (2026.01)
(Continued)

(52) U.S. Cl.
CPC .......... *H10P 72/53* (2026.01); *H10P 72/0428* (2026.01); *H10P 90/00* (2026.01); *H10W 46/00* (2026.01); *H10W 46/301* (2026.01)

(58) Field of Classification Search
CPC ............ H01L 21/681; H01L 21/02002; H01L 21/67092; H01L 23/544;
(Continued)

(56) References Cited

U.S. PATENT DOCUMENTS

2009/0251699 A1* 10/2009 George ................ H01L 23/544 356/399
2012/0092638 A1* 4/2012 Park ..................... G03F 9/7088 355/72

(Continued)

FOREIGN PATENT DOCUMENTS

CN 109285803 A 1/2019
CN 109904105 A 6/2019

(Continued)

*Primary Examiner* — Jeff W Natalini
*Assistant Examiner* — Ian Isaac Degrasse
(74) *Attorney, Agent, or Firm* — BAYES PLLC

(57) ABSTRACT

A method and apparatus for wafer bonding are provided. The method includes: determining a first position parameter of a first alignment mark on a first wafer and a second position parameter of a second alignment mark on a second wafer by using a first type of optical beam; moving the first wafer and the second wafer to be opposite to each other by changing a relative position between the first wafer and the second wafer according to the first position parameter and the second position parameter, to achieve a first alignment of the first alignment mark and the second alignment mark; adjusting the relative position between the first wafer and the second wafer by using a second type of optical beam, to achieve a second alignment of the first alignment mark and the second alignment mark; and bonding the first wafer to the second wafer.

20 Claims, 11 Drawing Sheets

(51) Int. Cl.
*H10P 72/50* (2026.01)
*H10P 90/00* (2026.01)

(58) Field of Classification Search
CPC ........... H01L 2223/54426; H10P 72/53; H10P 72/0428; H10P 90/00; H10W 46/00; H10W 46/301
See application file for complete search history.

(56) References Cited

U.S. PATENT DOCUMENTS

| | | | | |
|---|---|---|---|---|
| 2015/0044786 | A1* | 2/2015 | Huang | H10P 72/0428 156/359 |
| 2017/0038562 | A1* | 2/2017 | Georgiev | H10F 39/026 |
| 2019/0355698 | A1* | 11/2019 | Guo | H01L 23/544 |

FOREIGN PATENT DOCUMENTS

| | | | |
|---|---|---|---|
| CN | 111584415 | A | 8/2020 |
| CN | 111900116 | A | 11/2020 |
| CN | 112018002 | A | 12/2020 |
| CN | 113031410 | A | 6/2021 |

* cited by examiner

METHOD AND APPARATUS FOR WAFER BONDING

CROSS-REFERENCE TO RELATED APPLICATIONS

The present application is a continuation of International Application No. PCT/CN2021/126190, filed on Oct. 25, 2021, the content of which is incorporated herein by reference in its entirety.

TECHNICAL FIELD

Implementations of the present disclosure relate to a method and apparatus for wafer bonding.

BACKGROUND

In recent years, Flash Memory has developed rapidly. The main feature of Flash Memory is that stored information can be maintained for a long time without power on. Flash Memory has the advantages of high integration level, fast storage speed, easy erasing, and re-writability. In order to further improve the Bit Density of Flash Memory and to reduce the Bit Cost, the three-dimensional Flash Memory (3D NAND Flash) technology has been developed rapidly.

At present, as a new technology, wafer bonding technology is widely used in the chip manufacturing industry, particularly in the 3D NAND Flash manufacturing field. The wafer bonding technique is a process in which two wafers with different functions are directly bonded together after identifying and aligning their marks. In the related art, a position error easily occurs in the alignment process, which results in bonding failure.

SUMMARY

Implementations of the present disclosure provide a wafer bonding method, including the following operations. A first position parameter of a first alignment mark on a first wafer is determined by using a first type of optical beam. A second position parameter of a second alignment mark on a second wafer is determined by using the first type of optical beam. The first wafer and the second wafer are moved to be opposite to each other by changing a relative position between the first wafer and the second wafer according to the first position parameter and the second position parameter, so that first alignment of the first alignment mark and the second alignment mark is achieved. The relative position between the first wafer and the second wafer is adjusted by using a second type of optical beam, so that second alignment of the first alignment mark and the second alignment mark is achieved. The first wafer and the second wafer are bonded.

The implementation of the present disclosure further provides a wafer bonding apparatus, including: a first bearing table, configured to hold a first wafer; herein the first wafer is provided with at least one first alignment mark; a second bearing table, opposite to the first bearing table, and configured to hold a second wafer; herein the second wafer is provided with at least one second alignment mark; a first alignment component, located on a side on which the first bearing table bears the first wafer, and configured to determine a first position parameter of the first alignment mark on the first wafer by using a first type of optical beam; a second alignment component, located on a side where the second bearing table bears the second wafer, and configured to determine a second position parameter of the second alignment mark on the second wafer by using the first type of optical beam; a mobile component, connected to the first bearing table and the second bearing table, and configured to move the first wafer and the second wafer to be opposite to each other by changing a relative position between the first wafer and the second wafer according to the first position parameter and the second position parameter, to achieve a first alignment of the first alignment mark and the second alignment mark; a third alignment component, located on a side of the first bearing table and/or a side of the second bearing table, and configured to control the mobile component to adjust, by using a second type of optical beam, the relative position between the first wafer and the second wafer to achieve a second alignment of the first alignment mark and the second alignment mark; and a bonding component, connected to the first bearing table and the second bearing table, and configured to bond the first wafer to the second wafer.

BRIEF DESCRIPTION OF THE DRAWINGS

One or more implementations are illustrated by the corresponding drawings. Unless otherwise stated, the drawings do not constitute scale limitations.

DETAILED DESCRIPTION

Figure 1:
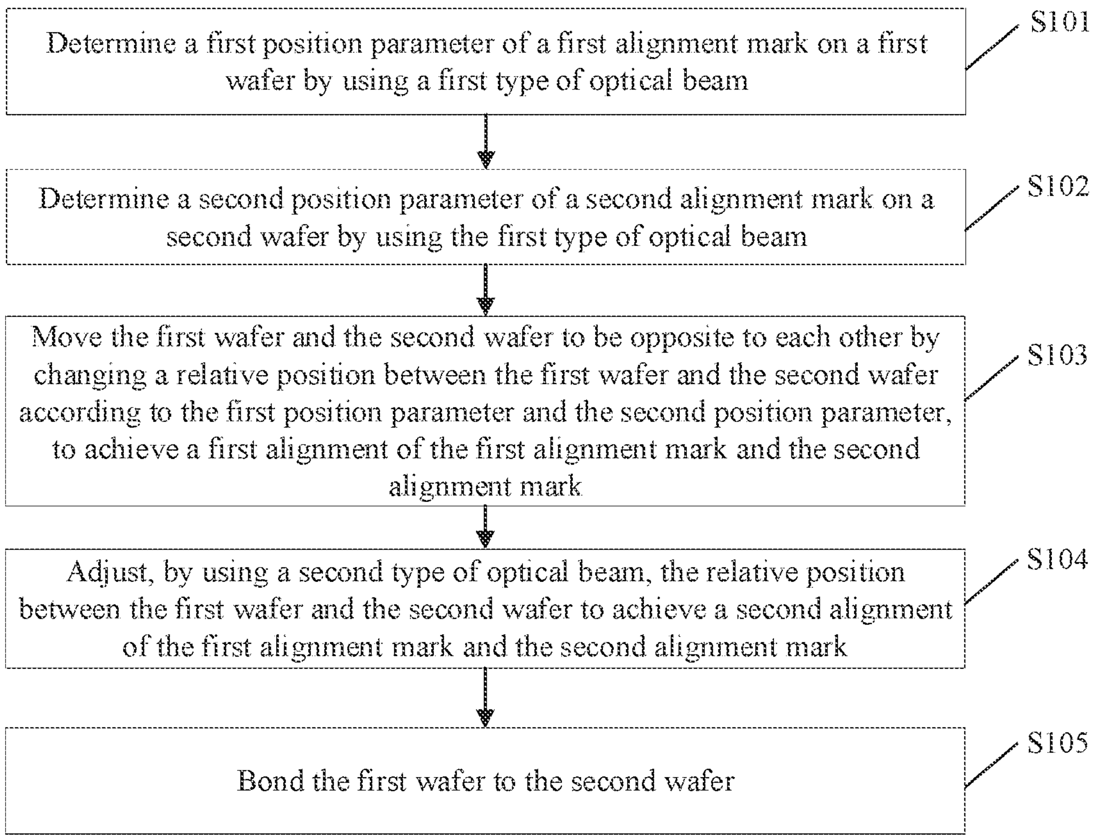
FIG. 1 is a flowchart of a wafer bonding method according to an implementation of the present disclosure.

Exemplary implementations of the present disclosure will be described below in detail with reference to the accompanying drawings. Although exemplary implementations of the present disclosure are illustrated in the accompanying drawings, it should be understood that the present disclosure may be implemented in various forms without being limited by the specific implementations described herein. On the contrary, these implementations are provided to enable a more thorough understanding of the present disclosure and to fully convey the scope of the present disclosure to those skilled in the art.

The spatial relationship terms such as “under”, “below”, “on” and “above” etc. may be used herein for convenience of description to describe the relationship between one element or feature shown in the drawings and other elements or features. It should be understood that, in addition to the orientation shown in the drawings, spatial relationship terms are intended to include different orientations of devices in use and operation. For example, if the apparatus in the drawings is turned, the element or feature described as “under” or “below” other elements will be described as “on” or “above” other elements. Thus, the exemplary terms “under” and “above” may include upper and lower orientations. Furthermore, the device may be oriented (rotated 90 degrees or otherwise) and the spatial relationship terms used herein are explained accordingly.

The terms used herein are intended only to describe implementations and are not a limitation of the present disclosure. When used herein, the singular terms “a/an”, “one” and “the” are also intended to include the plural forms unless the context clearly indicates otherwise. It should also be appreciated that, when used in the detailed description, the terms “comprise” and/or “include” determine the existence of the features, integers, steps, operations, elements and/or components, but do not exclude the existence or addition of one or more other features, integers, steps, operations, elements, components and/or groups. When used herein, the term “and/or” includes any and all combinations of the related listed items.

In order to better understand the present disclosure, detailed operations and structures will be proposed in the following description to illustrate the technical solution of the present disclosure. Detailed descriptions of the implementations of the present disclosure are as follows. However, in addition to these detailed descriptions, the present disclosure may also have other implementations.

As shown in FIG. 1, an implementation of the present disclosure provides a wafer bonding method, including the following operations.

At block S101, a first position parameter of a first alignment mark on a first wafer is determined by using a first type of optical beam.

At block S102, a second position parameter of a second alignment mark on a second wafer is determined by using the first type of optical beam.

At block S103, a first alignment is performed. In some implementations, the first wafer and the second wafer are moved to be opposite to each other by changing a relative position between the first wafer and the second wafer according to the first position parameter and the second position parameter, so that the first alignment mark and the second alignment mark are aligned.

At block S104, a second alignment is performed. In some implementations, the relative position between the first wafer and the second wafer is adjusted by using a second type of optical beam, so that the first alignment mark and the second alignment mark are aligned.

At block S105, the first wafer and the second wafer are bonded.

It should be noted that the first wafer and the second wafer in the implementations of the present disclosure may be determined according to practical production requirements. Here, the wafer may be a single-crystal silicon wafer used for manufacturing a semiconductor circuit, a silicon wafer on which an element or a circuit is mounted after processing, or a chip substrate made of another material known to those skilled in the art.

The alignment during wafer bonding may be achieved by optical alignment. In some implementations, the alignment of wafers can be achieved by positioning one wafer relative to another and aligning the two wafers with alignment marks observed with an optical objective lens. In the implementations of the present disclosure, the observation may be performed by a Charge Coupled Device (CCD) observation mirror. Here, the CCD observation mirror here and the optical source may be integrated or set separately. The optical source may be configured to emit the first type of optical beam or a second type of optical beam, and the CCD may be configured to receive the first type of optical beam or a second type of optical beam.

Figure 2A:
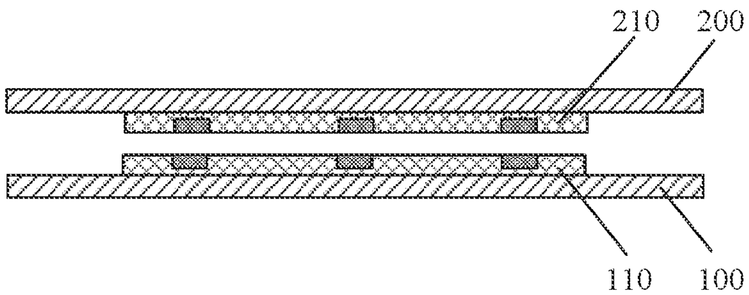
FIG. 2A is an exemplary structural diagram of a bearing table for fixing a wafer according to an implementation of the present disclosure.

As shown in FIG. 2A, the first wafer 110 and the second wafer 120 of the implementation may be fixed to a corresponding first bearing table 100 and a corresponding second bearing table 200 respectively. The above-mentioned bearing tables may include, but are not limited to, a vacuum chuck, a chuck, a robot arm, or the like. The bearing tables may move freely as required so that the relative position between the first wafer and the second wafer may be adjusted to achieve the alignment, and the first wafer and the second wafer may be moved relatively to achieve the bonding.

Figure 2B:
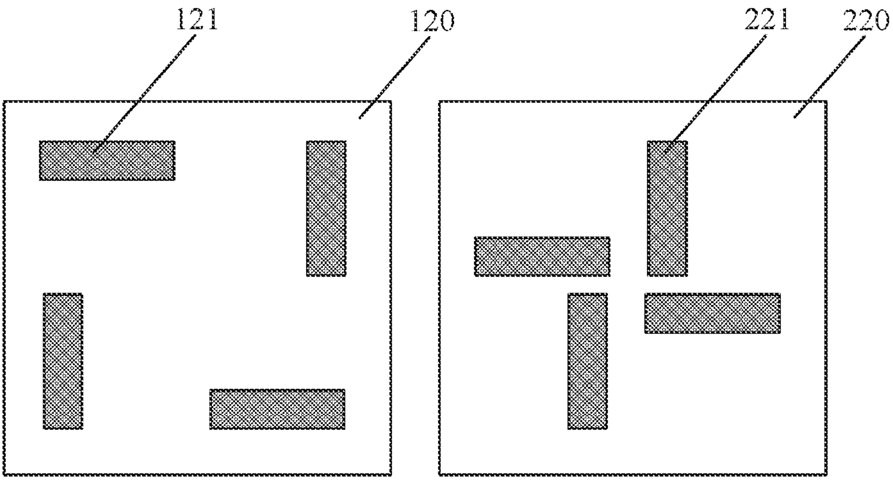
FIG. 2B is an exemplary structural diagram of a first alignment mark and a second alignment mark according to an implementation of the present disclosure.

In the implementations of the present disclosure, a first alignment may be performed. The first wafer and the second wafer may be aligned by using the first type of optical beam. For example, patterned alignment marks may be provided on both the first wafer and the second wafer, and the alignment marks may include a light transmitting part and an opaque part. Here the opaque part may be made of metal, ceramic, or other opaque material, and the light transmitting part may be hollow out and expose the wafer surface without covering the opaque material. As shown in FIG. 2B, the first alignment mark 120 of the first wafer may include multiple opaque patterns 121 and the second alignment mark 220 of the second wafer may include multiple opaque patterns 221. The sizes (e.g., circumference, surface area, shape, etc.) of the multiple opaque patterns 121 and the multiple opaque patterns 221 are the same or different. Furthermore, the opaque patterns of the first alignment mark may be axisymmetric or centrally symmetric patterns with a first alignment reference point, which may be a symmetric center of the patterns, or an intersection point of edges for easy identification; the opaque patterns of the second alignment mark may be symmetric patterns with a second alignment reference point. Moreover, the projection of the alignment reference points of the first alignment mark and the second alignment mark in the observation mirror may be acquired by the observation, and the alignment of the first wafer and the second wafer can be determined by judging whether the relative position between the two alignment reference points in the observation mirror reaches a predetermined position range. The alignment reference points between the first alignment mark and the second alignment mark in the implementation of the present disclosure may be determined according to actual production requirements. Multiple first alignment reference points and corresponding second alignment reference points may be selected for the calculation of relative position parameters, so that alignment accuracy can be increased to improve product reliability.

In some implementations, the operation that the first position parameter of the first alignment mark on the first wafer is determined by using the first type of optical beam, includes the following operations.

The first wafer is irradiated by using the first type of optical beam.

The second reflection image formed by the reflection of the first type of optical beam at the first alignment mark is acquired.

The first position parameter is determined according to the second reflection image.

Figure 3:
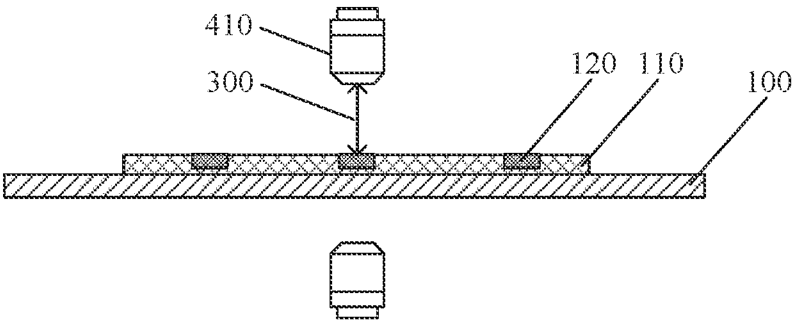
FIG. 3 is a structural diagram of determining a first position parameter according to an implementation of the present disclosure.

In the implementations of the present disclosure, a lens integrated with an optical source and an observation mirror may be used to emit and receive the above-mentioned first type of optical beam. For example, as shown in FIG. 3, a first wafer alignment lens 410 may be placed on one side of the first wafer 110 and held stationary, and then the first type of optical beam 300 is emitted. The first type of optical beam 300 here may be uniform parallel light, that is, optical beams that have little attenuation and are parallel to each other in a direction perpendicular to the surface of the first wafer 110, and may be reflected at the first alignment mark 120 and absorbed by the first wafer 110. Thus, the emitted first type of optical beam 300 may irradiate the first wafer 110. If the first alignment mark is irradiated, the reflection image at the position of the first alignment mark, that is, the second reflection image, can be obtained on the observation mirror by the reflection of the light. It is possible to determine whether the first wafer is aligned with the lens according to the second reflection image, and to determine the first position parameter. It should be noted that at least two first wafer alignment lenses 410 may be used, and are located on one side and the other side of the first bearing table 100 respectively, so that the first position parameter can be determined according to different bearing surfaces of the first bearing table 100 in practical operation.

It should be noted that the first wafer of the present disclosure may be fixed to any surface of the first bearing table. For example, as shown in FIG. 3, the first wafer may be fixed to the upper surface of the first bearing table. In this case, the first wafer alignment lens may be correspondingly located on the side of the upper surface of the first bearing table. If the first wafer is fixed to the lower surface of the first bearing table, the first wafer alignment lens may be correspondingly on the side of the lower surface of the first bearing table. The optical source or the observation mirror in the implementation of the present disclosure is used to detect whether the first alignment mark and the second alignment mark are aligned at the corresponding position thereof. If there are multiple first alignment marks on the first wafer, multiple sets of optical sources and observation mirrors or multiple first wafer alignment lenses integrated with optical sources and observation mirrors are provided to perform the alignment detection for the first alignment marks at their respective positions.

In some implementations, the operation that the second position parameter of the second alignment mark on the second wafer is determined by using the first type of optical beam, includes the following operations:

The second wafer is irradiated by using the first type of optical beam.

The third reflection image formed by the reflection of the first type of optical beam at the second alignment mark is acquired.

The second position parameter is determined according to the third reflection image.

Figure 4:
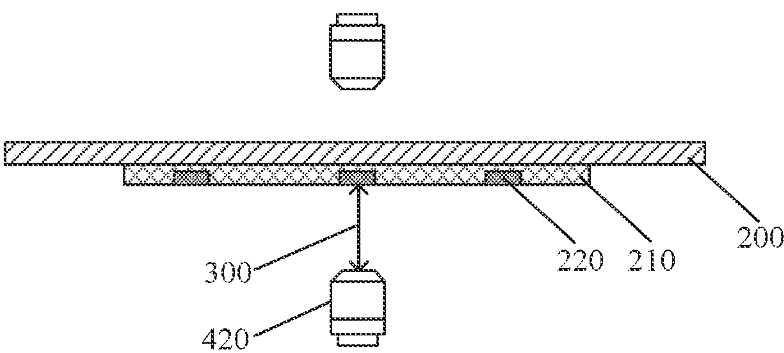
FIG. 4 is a structural diagram of determining a second position parameter according to an implementation of the present disclosure.

Likewise, in the implementations of the present disclosure, a lens integrated with an optical source and an observation mirror may be placed on one side of the second wafer to emit and receive the above-mentioned first type of optical beam. For example, as shown in FIG. 4, a second wafer alignment lens 420 may emit the first type of optical beam 300 after being held stationary. Accordingly, the first type of optical beam 300 here may be uniform parallel light, that is, optical beams that have little attenuation and are parallel to each other in a direction perpendicular to the surface of the second wafer 200, and may be reflected at the second alignment mark 220 and absorbed by the second wafer 210. Thus, the emitted first type of optical beam 300 may irradiate the second wafer 210. If the second alignment mark is irradiated, a reflection image, that is, the third reflection image, can be obtained on the observation mirror by the reflection of the light at the position of the second alignment mark. It is possible to determine whether the second wafer is aligned with the lens according to the third reflection image, and to determine the second position parameter. It should be noted that at least two second wafer alignment lenses 420 may be used, and are located on one side and the other side of the second bearing table 200 respectively, so that the second position parameter can be determined according to different bearing surfaces of the second bearing table 200 in practical operation.

It should be noted that the second wafer of the present disclosure may be fixed to either surface of the second bearing table. For example, as shown in FIG. 4, if the first wafer is fixed on the upper surface of the first bearing table (not shown), the second wafer may be correspondingly fixed to the lower surface of the second bearing table, and the second wafer alignment lens may be correspondingly on the side of the lower surface of the second bearing table. If the first wafer is fixed on the lower surface of the first bearing table, the second wafer may be correspondingly fixed to the upper surface of the second bearing table, and the second wafer alignment lens may be correspondingly on the side of the lower surface of the second bearing table. In the implementations of the present disclosure, if there are multiple second alignment marks on the second wafer, multiple sets of optical sources and observation mirrors or multiple second wafer alignment lenses integrated with optical sources and observation mirrors are provided to perform the alignment detection for the second alignment marks at their respective positions.

In the implementations of the present disclosure, the first wafer alignment lens configured to determine the first position parameter and the second wafer alignment lens configured to determine the second position parameter may be two sets of wafer alignment lenses. One set is oriented towards the surface the first wafer and another set is oriented towards the surface the second wafer. During the process of the determination of the above-mentioned first position parameter and second position parameter, the first wafer and the second wafer are located at different positions and are not shielded from each other in a direction perpendicular to the surface of the first wafer/second wafer. The first position parameter and the second position parameter, such as the coordinate value of the first alignment mark relative to the predetermined coordinate system of the apparatus and the coordinate value of the second alignment mark relative to the predetermined coordinate system of the apparatus, can be determined by the two sets of wafer alignment lenses. The direction and distance of movement required for the alignment of the first wafer and the second wafer may be calculated according to the first position parameter and the second position parameter. The bearing table is moved in the direction parallel to the surface of the wafers so that the first wafer and the second wafer are aligned in a vertical direction, that is, the first alignment is achieved.

In the implementations of the present disclosure, multiple sets of lenses integrated with optical sources and observation mirrors may be used to align the multiple sets of alignment marks, so that alignment errors can be reduced, alignment accuracy can be increased, and device yield can be improved.

In some implementations, the first position parameter is a coordinate parameter of the first wafer relative to a predetermined first coordinate system.

The second position parameter is a coordinate parameter of the second wafer relative to a predetermined second coordinate system.

In the implementations of the present disclosure, the first position parameter and the second position parameter may be coordinate parameters. For example, the first wafer alignment lens for aligning the first wafer may be used as a reference origin of the predetermined first coordinate system, and the first coordinate system may be established. The first coordinate system herein may be a spatial rectangular coordinate system, that is, the plane parallel to the first wafer is the xy plane of the coordinate system, and the direction perpendicular to the first wafer is the z axis. At this time, the process of aligning the first wafer is actually a process of moving the first alignment mark to a corresponding coordinate point, and the first position parameter is a coordinate parameter of a predetermined position. Here, the first position parameter may be selected according to the distance between the first wafer alignment lens and the first wafer and other actual requirements, and the alignment process is to move the center of the alignment mark in the reflection image onto the z axis.

Similarly, the second coordinate system may also be a spatial rectangular coordinate system of which the reference origin is the second wafer alignment lens for aligning the second wafer. Therefore, the second position parameter here may be selected according to the distance between the second wafer alignment lens and the second wafer and other actual requirements.

The implementations of the present disclosure employ coordinate parameters to determine the position of the alignment marks. Thus, it is convenient to determine the direction and distance of movement required for the first alignment.

Figure 5:
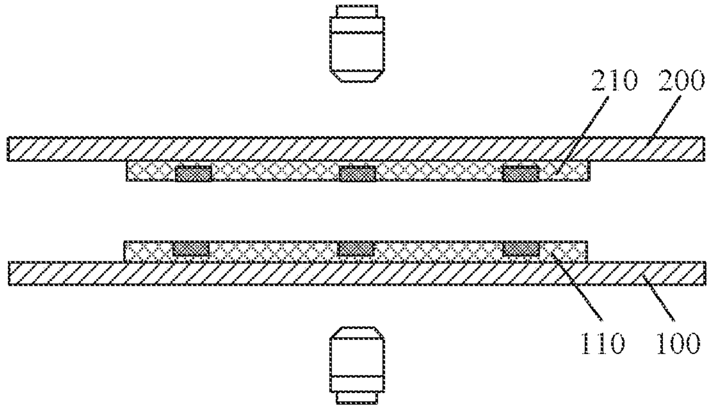
FIG. 5 is a structural diagram of opposing positions according to an implementation of the present disclosure.

In the implementations of the present disclosure, as shown in FIG. 5, after determining the position parameters of the alignment marks on the first wafer 110 and the second wafer 210 respectively, the first wafer 110 and the second wafer 210 may be moved to be opposite to each other by moving the first bearing table 100 and/or the second bearing table 200. The opposing positions here can be determined according to actual requirements. For example, the first wafer remains stationary, and the second wafer is moved until the second coordinate system coincides with the first coordinate system; or the second wafer remains stationary, and the first wafer is moved until the first coordinate system coincides with the second coordinate system at a certain position in the space, etc. After the movement is completed, both the first alignment mark on the first wafer and the second alignment mark at the corresponding position on the second wafer may have a projection in the xy plane. It should be noted that the projection of the first alignment mark in the xy plane may have a first alignment reference point and the projection of the second alignment mark in the xy plane may have a second alignment reference point. Here, the first alignment reference point and the second alignment reference point are determined relative to the pattern of the first alignment mark and the pattern of the second alignment mark respectively. For example, if the first alignment mark has a single uniform pattern, the first alignment reference point is a center of the pattern; if the first alignment mark has multiple patterns, the first alignment reference point is a center of multiple patterns, and the same applies for the second alignment reference point. Here, the first alignment reference point and the second alignment reference point acquired in the observation mirror may be located at the same coordinate position, or may be located at different coordinate positions, and whether the alignment is achieved is determined according to the actual predetermined alignment conditions.

It should be noted that the first type of optical beam used for the first alignment in the implementations of the present disclosure cannot pass through the first wafer and the second wafer. Therefore, in the process of aligning the first wafer and the second wafer respectively, the optical source and the observation mirror are placed on one side of the bonding surface of the wafer, so that the alignment may be performed by the reflection of light. Furthermore, during the process of moving in a direction parallel to the surface of the first wafer and/or the surface of the second wafer and performing the first alignment, the optical source emitting the first type of optical beam may be turned off and the optical source emitting the second type of optical beam may be turned on. Thus, it is possible to perform two alignment operations with two different types of optical beams, so that the accuracy of alignment and the reliability of the product are improved.

In some implementations, before performing the second alignment, the method further includes:

The relative distance between the first wafer and the second wafer is adjusted until the relative distance satisfies a predetermined bonding distance.

Figure 6:
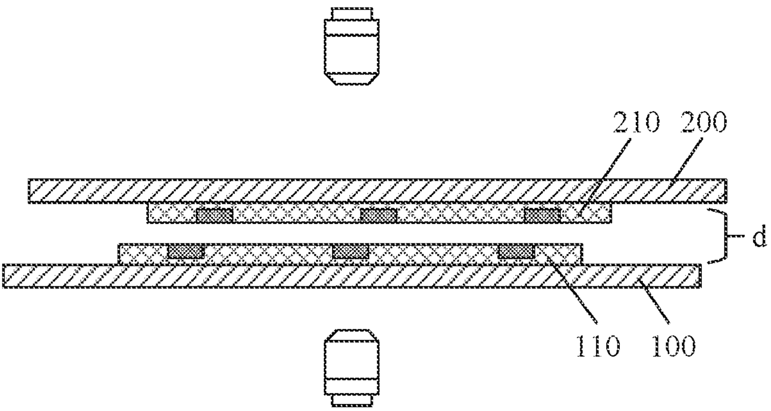
FIG. 6 is a structural diagram of a position error generated in the related art.

In the implementations of the present disclosure, if the first coordinate system and the second coordinate system do not coincide, position compensation is required, that is, the relative position between the first wafer and the second wafer is adjusted until the first coordinate system and the second coordinate system coincide. The bonding operation can be performed after the above-mentioned first alignment. For example, the relative distance between the first wafer and the second wafer is adjusted, that is, the first wafer and the second wafer are relatively moved in the direction of z axis to a position to be bonded, on which the relative distance between the first wafer and the second wafer satisfies the predetermined bonding distance, and then the first wafer and the second wafer are bonded. However, as shown in FIG. 6, in the related art, a certain position deviation may occur in the process of moving the first wafer 110 and the second wafer 210 to the position to be bonded (bonding distance d), that is, the first coordinate system and the second coordinate system no longer coincide, which may reduce the bonding effect and affect the product performance. Therefore, in the implementations of the present disclosure, a second alignment can be performed by using the second type of optical beam in the above-mentioned process, so that the alignment accuracy can be greatly increased, and the product reliability can be improved.

It should be noted that the relative position parameter in this implementation of the present disclosure is a coordinate parameter on the basis of the above-mentioned first coordinate system and second coordinate system. The position parameter of the first alignment mark may still be determined based on the first coordinate system, and the position parameter of the second alignment mark may still be determined based on the second coordinate system.

In some implementations, the relative distance between the first wafer and the second wafer is adjusted until the relative distance satisfies a predetermined bonding distance, which includes the following operation:

The position of the first wafer and/or a position of the second wafer is adjusted in a direction perpendicular to the first wafer and/or the second wafer until the relative distance between the first wafer and the second wafer satisfies the predetermined bonding distance.

In the implementation of the present disclosure, the first bearing table and/or the second bearing table may be moved in a direction perpendicular to the first wafer and/or the second wafer so that the relative distance between the first wafer and the second wafer satisfies the predetermined bonding distance. For example, the first bearing table remains stationary, and the second bearing table is moved to reduce the relative distance between the first wafer and the second wafer until the relative distance satisfies the predetermined bonding distance; or the second bearing table remains stationary, and the first bearing table is moved to reduce the relative distance between the first wafer and the second wafer until the relative distance satisfies the predetermined bonding distance; or the first bearing table and the second bearing table are moved to reduce the relative distance between the first wafer and the second wafer until the relative distance satisfies the predetermined bonding distance, etc.

It should be noted that the above-mentioned predetermined bonding distance needs to be determined according to practical bonding conditions and production requirements. The optical source of the above-mentioned first type of optical beam may be kept off during the movement of the bearing table, so that the cost is saved and the loss of device is reduced. The optical source of the second type of optical beam is turned on to perform the second alignment after the relative distance between the first wafer and the second wafer satisfies a predetermined bonding distance.

In some implementations, the second alignment includes the following operations.

The relative position parameter of the first alignment mark and the second alignment mark are determined by using the second type of optical beam.

The relative position between the first wafer and the second wafer is adjusted according to the relative position parameter so that the first alignment mark and the second alignment mark are aligned.

In the implementations of the present disclosure, the first alignment is a process of moving the bonding surface of the first wafer and the bonding surface of the second wafer to be opposite to each other by changing a relative position between the first wafer and the second wafer. During the process of the second alignment, an error of the relative position due to the relative distance change is reduced based on the fact that the bonding surface of the first wafer and the bonding surface of the second wafer are opposite to each other, and the first alignment reference point and the second alignment reference point are adjusted for the second time to meet the alignment conditions before the bonding operation.

Figure 7A:
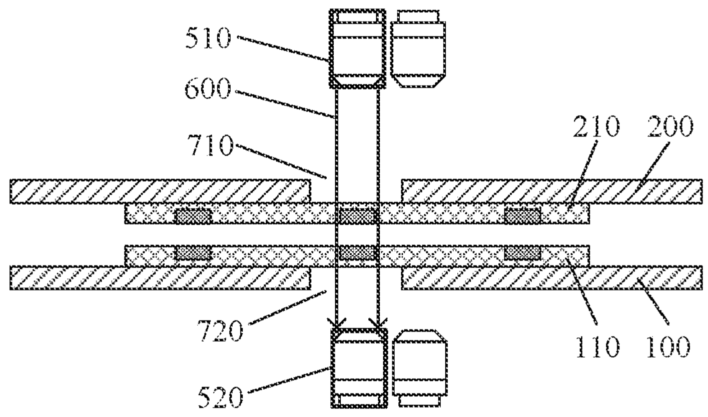
FIGS. 7A and 7B are structural diagrams of determining a relative position parameter based on the transmission image according to an implementation of the present disclosure.

As shown in FIG. 7A, in the implementations of the present disclosure, the second type of optical beam 600 may be emitted by the optical source 510 located on a side of the first bearing table 100, that is opposite to the side on which the first wafer 110 is located, or a side of the second bearing table 200, that is opposite to the side on which the second wafer 210 is located, and the opposing positions may be irradiated through an opening 710 or 720 on the bearing table. It should be noted that, since the bearing table is generally opaque to light, a corresponding opening is provided according to the position parameter of the alignment mark on the wafer, so that the second type of optical beam can irradiate the first wafer and the second wafer. The opening herein corresponds to a specific alignment mark, and one opening may correspond to one alignment mark and a group of optical elements. The opening may allow the second type of optical beam to sufficiently irradiate the surface of the first wafer and/or the second wafer, and the first alignment mark and the second alignment mark may be exposed within the coverage area of the opening so that the corresponding alignment mark can be sufficiently observed through the observation mirror. Furthermore, after the first wafer and the second wafer are respectively placed on the bearing table, the alignment marks need to be positioned within the coverage area of the opening, and may be positioned at a center or any position of the opening as long as they can be recognized through the observation mirror. Moreover, the second type of optical beam may be emitted by the same optical source as used in the first alignment, or may be emitted by other optical sources. For example, if the second type of optical beam is emitted by the same optical source as used in the first alignment, the optical source switching module needs to be provided in the corresponding lens, that is, after the first alignment is completed, the first type of optical beam is switched to the second type of optical beam and the second type of optical beam is emitted; if other optical sources are used for emitting the second type of optical beam, the other optical sources may be positioned next to the lens for the first alignment; thus, after the first alignment is completed, the bearing table can be moved a small distance in the XY plane to make the second type of optical beam passing through the opening, thereby reducing the time for adjusting the position of the wafer.

In some implementations, the relative position parameter includes a relative position parameter between the first alignment mark and the second alignment mark in a direction parallel to the first wafer and/or the second wafer.

The second alignment includes the following operations.

The position of the first wafer and/or the position of the second wafer is adjusted in a direction parallel to the first wafer and/or the second wafer according to the relative position parameter so that the first alignment mark and the second alignment mark are aligned.

The position parameter and the relative position parameter in the implementations of the present disclosure may be coordinate parameters acquired in the plane of the observation mirror, and the plane of the observation mirror is parallel to the plane of the first wafer and/or the second wafer. Therefore, the corresponding relative position parameter is also a relative coordinate parameter in a direction parallel to the first wafer and/or the second wafer. For example, if the first bearing table and the second bearing table are located in the horizontal direction, the direction parallel to the first wafer and/or the second wafer is the horizontal direction, and the direction perpendicular to the first wafer and/or the second wafer is the vertical direction. After the relative distance between the first wafer and the second wafer in the vertical direction satisfies a predetermined bonding distance, the optical source may be turned on, and the second type of optical beam may be used to determine whether the first alignment mark and the second alignment mark are aligned or not in the horizontal direction. If the first alignment mark and the second alignment mark are not aligned, the second alignment may be performed, for example, the relative position between the first wafer and the second wafer may be adjusted horizontally according to the relative position parameters by moving the first bearing table and/or the second bearing table until the first alignment mark and the second alignment mark are aligned.

After the first alignment in the implementations of the present disclosure, the optical source may be turned off for the adjustment of the relative distance between the first wafer and the second wafer. The optical source may be turned on before the second alignment, and the relative position between the first wafer and the second wafer is adjusted by using the second type of optical beam to perform the second alignment, which may reduce the use of optical sources and save costs.

In some implementations, the second alignment includes the following operations.

The position of the first wafer and/or the position of the second wafer are adjusted in the direction perpendicular to the first wafer and/or the second wafer, and the position of the first wafer and/or the position of the second wafer are adjusted in a direction parallel to the first wafer and/or the second wafer by using the second type of optical beam, so that the second alignment of the first alignment mark and the second alignment mark are achieved and the relative distance between the first wafer and the second wafer satisfies a predetermined bonding distance.

In the implementations of the present disclosure, it is also possible to keep the optical source on and perform a real-time alignment operation by using the second type of optical beam while the relative distance between the first wafer and the second wafer is being adjusted. Here, the term "real-time" means that the position coordinates of the first alignment mark and the second alignment mark in the direction parallel to the first wafer and/or the second wafer can be continuously acquired in the observation mirror during the adjustment process, and the adjustment of the first bearing table and/or the second bearing table can be controlled in the direction parallel to the first wafer and/or the second wafer in real-time according to the relative position parameters corresponding to the position coordinates of the first wafer and the second wafer. It should be noted that if the first bearing table and the second bearing tables are located in the horizontal direction, the above-described adjustment process includes the second alignment for the first wafer and the second wafer in the horizontal direction, and the relative distance between the first wafer and the second wafer satisfies predetermined bonding distance in the vertical direction, which may be performed synchronously, that is, while the relative distance between the first wafer and the second wafer is reduced, the relative position between the first wafer and the second wafer may be adjusted so that the second alignment of the first alignment mark and the second alignment mark may be achieved.

In the implementation of the present disclosure, after the first alignment, the optical source can be kept on, and the alignment detection and dynamic adjustment can be performed in real time by using the second type of optical beam, to reduce the alignment deviation caused during the process of moving the wafer in the vertical direction, so as to improve the alignment accuracy and product reliability.

In some implementations, the second alignment includes the following operations.

The relative position between the first alignment mark and the second alignment mark is irradiated by using the second type of optical beam.

The first transmission image of the first alignment mark and the second alignment mark is acquired on the side on which the second type of optical beam emerges from the first wafer and the second wafer.

The relative position between the first wafer and the second wafer is adjusted according to the first transmission image, so that the second alignment of the first alignment mark and the second alignment mark is achieved.

It should be noted that the second type of optical beam designed in the implementations of the present disclosure may also be uniform parallel light and may be reflected at the alignment mark and penetrate the wafer. In this way, the second type of optical beam emitted by the optical source may be incident in a direction perpendicular to the opening on the surface of the first wafer and the second wafer, and irradiate the relative position of the first alignment mark and the second alignment mark with a small portion of projection coincidence. For example, as shown in FIG. 7A, the lenses 510 and 520 for the second alignment are provided opposite to each other relative to the first wafer 110 and the second wafer 210, the two wafer alignment lenses may be located in the direction of z axis of the coordinate system, and the connection lines of the wafer alignment lenses 510 and 520 are perpendicular to the surfaces of the first wafer 110 and the second wafer 210. Furthermore, one of the lenses may emit the second type of optical beam as an optical source, and another lens may receive the second type of optical beam as an observation mirror. Since the second type of optical beam can pass through the wafer, the second type of optical beam passing through the first wafer and the second wafer can be received on the observation mirror on the opposite side of the optical source relative to the first wafer and the second wafer, and the transmission image of the first alignment mark and the second alignment mark, which is the first transmission image, can be acquired. The first transmission image herein refers to an image acquired on the opposite side of the optical source relative to the first wafer and the second wafer after the second optical beam passes through the first wafer and the second wafer. The first transmission image includes the first projection image of the first alignment mark in the first wafer and the second projection image of the second alignment mark in the second wafer. That is, the optical source emitting the second type of optical beam and the lens acquiring the first transmission image are located opposite to each other relative to the wafers.

Figure 7B:
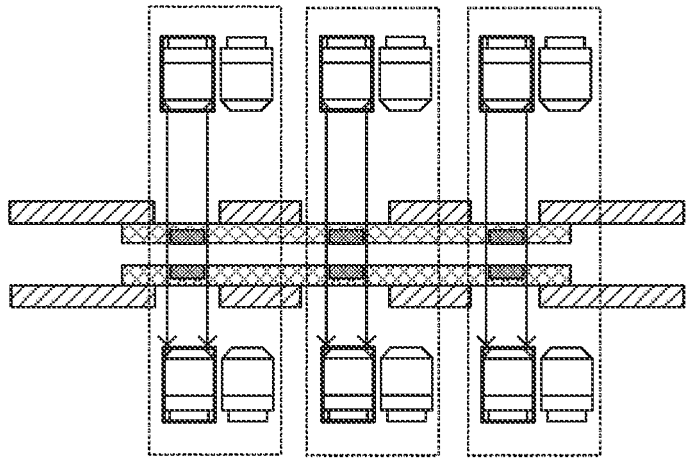

It should be noted that in some implementations, as shown in FIG. 7B, the aforementioned lens for alignment may include at least one set of lenses, herein each set includes multiple lenses for the first alignment and for the second alignment. Each set of lenses here corresponds to a set of alignment marks on the first wafer and the second wafer, that is, the relative position parameter can be determined by the first transmission image of the corresponding first alignment mark and the second alignment mark formed at the corresponding position. For example, in the case where the alignment mark is located at the edge of the wafer, the set of lenses is also located on the bearing table at the position corresponding to the edge of the corresponding wafer, and in the case where the alignment mark is located at the center of the wafer, the set of lenses is also located on the bearing table at the position corresponding to the center of the corresponding wafer.

The relative position parameter of the first alignment mark and the second alignment mark in the first coordinate system and the second coordinate system may be determined according to the transmission image in the observation mirror, herein the relative position parameters may be coordinate parameters.

In some implementations, the first transmission image includes:

the first projection image of the first alignment mark and the second projection image of the second alignment mark.

In the implementations of the present disclosure, when the second type of optical beam passes through the first wafer, the first alignment mark is opaque. Thus, the projection of the first alignment mark on the xy plane in the first coordinate system is formed, which is the first projection image. Similarly, when the second type of optical beam passes through the second wafer, the second alignment mark is opaque. Thus, the projection of the second alignment mark on the xy plane in the second coordinate system is formed, which is the second projection image. For example, if the second type of optical beam irradiates the surface of the first wafer and emerges from the back surface of the irradiation surface of the second wafer, the first projection image is a projection image of the first alignment mark in the observation mirror when the second type of optical beam passes through the first wafer and the second wafer, and the second projection image is a projection image of the second alignment mark in the observation mirror when the second type of optical beam passes through the second wafer.

It should be noted that the first transmission image herein needs to be determined according to the patterns of the first alignment mark and the second alignment mark. If the first projection image and the second projection image overlap, the overlapping projection images are acquired in the observation mirror.

In some implementations, the relative position between first wafer and the second wafer is adjusted by using the second type of optical beam so that the second alignment of the first alignment mark and the second alignment mark is achieved, which includes the following operations.

The relative position between the first alignment mark and the second alignment mark with at least partial overlapping projection is irradiated by using the second type of optical beam.

The first reflection image formed by the reflection of the first alignment mark and the second alignment mark is acquired on a side on which the second type of optical beam irradiates the first wafer.

The relative position between the first wafer and the second wafer is adjusted according to the first reflection image so that the second alignment of the first alignment mark and the second alignment mark is achieved.

Figure 8A:
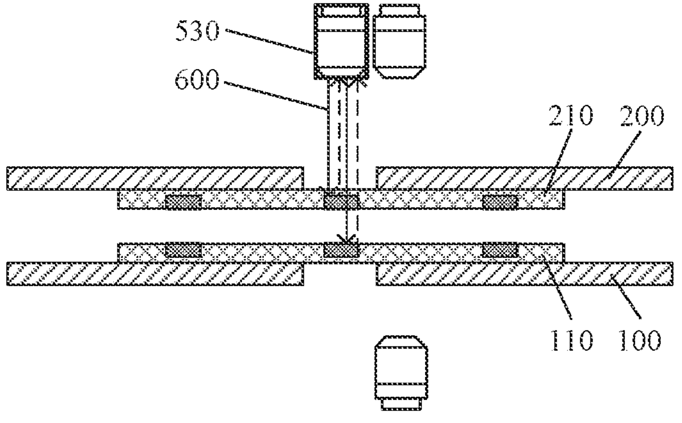
FIGS. 8A and 8B are structural diagrams of determining a relative position parameter based on the reflection image according to an implementation of the present disclosure.

As shown in FIG. 8A, in the implementations of the present disclosure, a lens 530 for the second alignment may be provided on a side of the first bearing table 100, that is opposite to the side on which the first wafer 110 is located, or a side of the second bearing table 200, that is opposite to the side on which the second wafer 210 is located, and the lens 530 may be located in the direction of z axis of the coordinate system. Furthermore, the lens 530 may integrate an optical source and an observation mirror, so that the second type optical beam 600 may be emitted and received by the wafer alignment lens 530. Here, for example, the second type of optical beam may irradiate the surface of the second wafer, herein a portion of the optical beam can be reflected at the second alignment mark and be acquired by the observation mirror; another portion of the optical beam may irradiate the first wafer after passing through the second wafer, and can be reflected at the first alignment mark and be acquired by the observation mirror which is on the same side of the first/second bearing table with the optical source. The reflection image reflected at the first alignment mark and the second alignment mark is the first reflection image. It should be noted that the first reflected image here is an image received on the same side of the first/second bearing table with the optical source, which is formed by the reflection of the second type of optical beam the at the first alignment mark and the second alignment mark after the second type of optical beam irradiates the first wafer and the second wafer. The first reflected image includes a projection image of the opaque part of the first alignment mark in the observation mirror and a projection image of the opaque part of the second alignment mark in the observation mirror.

Figure 8B:
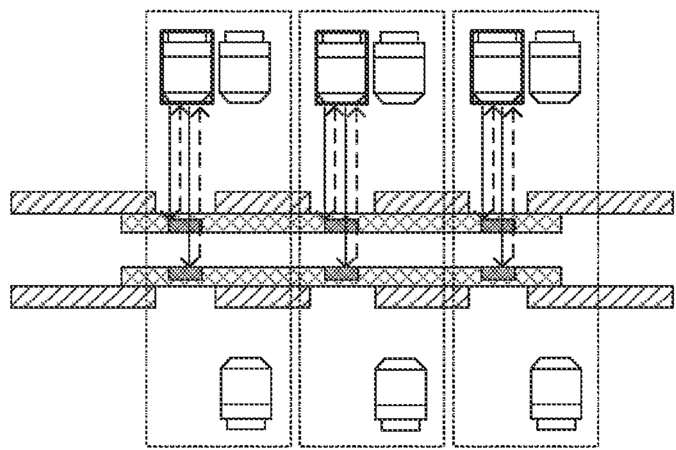

In some implementations, as shown in FIG. 8B, the aforementioned lens for alignment may include at least one set of lenses, herein each set of lenses includes multiple lenses for the first alignment and for the second alignment. Each set of lenses here corresponds to a set of alignment marks on the first wafer and the second wafer, that is, the relative position parameter can be determined by the first reflection image of the corresponding first alignment mark and the second alignment mark formed at the corresponding positions. For example, in the case where the alignment marks are located at the edge of the wafer, the set of lenses is also located on the bearing table at the position corresponding to the edge of the corresponding wafer, and in the case where the alignment marks are located at the center of the wafer, the set of lenses is also located on the bearing table at the position corresponding to the center of the corresponding wafer.

Similarly, the relative position parameter of the first alignment mark and the second alignment mark in the first coordinate system and the second coordinate system may be determined according to the reflection image in the observation mirror, herein the relative position parameter may be the coordinate parameter.

In some implementations, the first reflection image includes:

a third projection image of the first alignment mark and a fourth projection image of the second alignment mark.

In the implementations of the present disclosure, when the second type of optical beam is reflected at the first alignment mark on the first wafer, there may be a projection on the xy plane in the first coordinate system, that is, the third projection image. Similarly, when the second type of optical beam is reflected at the second alignment mark on the second wafer, there may be a projection on the xy plane in the second coordinate system, that is, the fourth projection image. For example, if the second type of optical beam irradiates the surface of the first wafer, the third projection image is a projection image formed by the reflection of the second type of optical beam at the irradiation surface of the first alignment mark, which can be acquired in the observation mirror, and the fourth projection image is a projection image formed by the second type of optical beam at the irradiation surface of the second alignment mark after passing through the first wafer, which can be acquired in the observation mirror.

It should be noted that the first reflection image here needs to be determined according to the patterns of the first alignment mark and the second alignment mark. If the first alignment mark and the second alignment mark have the same size and pattern, after the second alignment of the first wafer and the second wafer, only the reflection projection image of the alignment mark near the side of the first/second bearing table on which the optical source emitting the second type of optical beam can be acquired in the observation mirror.

In some implementations, the first alignment mark includes a first alignment reference point, and the second alignment mark includes a second alignment reference point. The first alignment includes the following operations.

A first distance between the first alignment reference point and the second alignment reference point in a first direction is made to be less than or equal to a first distance threshold; and/or a second distance between the first alignment reference point and the second alignment reference point in a second direction is made to be less than or equal to a second distance threshold; and/or the second alignment includes the following operations.

A third distance between the first alignment reference point and the second alignment reference point in the first direction is made to be less than or equal to a third distance threshold; and/or a fourth distance between the first alignment reference point and the second alignment reference point in the second direction is made to less than or equal to a fourth distance threshold.

Herein the first direction and the second direction are perpendicular to each other in a direction parallel to the first wafer and/or the second wafer.

The first distance threshold is greater than the third distance threshold and the second distance threshold is greater than the fourth distance threshold.

The position parameter in the implementation of the present disclosure may be a coordinate parameter. Therefore, the relative position parameter may be a relative coordinate parameter of the first alignment mark and the second alignment mark. For example, the pattern of the first alignment mark may have a first alignment reference point, and the pattern of the second alignment mark may have a second alignment reference point. Herein the alignment reference point may be selected according to actual requirements, such as, a center of the pattern or a specific point in the pattern or the like. A planar rectangular coordinate system may be established in the observation mirror. In the same coordinate system, the first alignment reference point may have a first coordinate point, the second alignment reference point may have a second coordinate point, and the first alignment reference point and the second alignment reference point may have a corresponding distance length in the same direction (x direction or y direction) of the above-mentioned coordinate system. For example, the first direction may be the x direction of the coordinate system, and an absolute value of the difference of the x-coordinates of the first alignment reference point and the second alignment reference point is the first distance; the second direction may be the y direction of the coordinate system, and an absolute value of the difference of the y-coordinates of the first alignment reference point and the second alignment reference point is the second distance. If the first distance is greater than the first distance threshold, the first wafer and the second wafer are misaligned; if the second distance is greater than the second distance threshold, the first wafer and the second wafer are also misaligned. The process of the first alignment of the first wafer and the second wafer is a process of adjusting the relative position between the first wafer and the second wafer such that the first distance is less than or equal to the first distance threshold and/or the second distance is less than or equal to the second distance threshold. It should be noted that the above-mentioned alignment conditions need to be determined according to actual requirements. For example, the process of the first alignment mentioned above may be coarse alignment, that is, a larger first distance threshold and a second distance threshold are used as alignment conditions, so that alignment steps can be reduced and the costs can be saved. If both the first distance and the second distance are required to be less than or equal to the corresponding distance thresholds, the relative position parameters of the first wafer and the second wafer in the x direction and the y direction need to be adjusted. If one of the first distance or the second distance is required to be less than or equal to the corresponding distance threshold, only the relative position parameter between the first wafer and the second wafer in the corresponding coordinate direction needs to be adjusted. Here the adjustment of the relative position parameter may be realized by holding the first wafer and adjusting the second wafer, or by holding the second wafer and adjusting the first wafer, or by adjusting the first wafer and the second wafer simultaneously until the first alignment of the first alignment mark and the second alignment mark are achieved.

Likewise, during the second alignment, the planar rectangular coordinate system may be re-established so that the third coordinate point of the first alignment reference point and the fourth coordinate point of the second alignment reference point may have a third distance in the coordinate system in the x direction and a fourth distance in the coordinate system in the y direction. For example, if both the third distance and the fourth distance for the second alignment are required to be less than or equal to the corresponding distance thresholds, the relative position parameter between the first wafer and the second wafer in the x direction and the y direction needs to be adjusted. If the third distance or the fourth distance is required to be less than or equal to the corresponding distance threshold, the relative position parameter between the first wafer and the second wafer in the corresponding coordinate direction needs to be adjusted. Here, the process of the second alignment may be accurate alignment, that is, a smaller third distance threshold and a smaller fourth distance threshold are used as alignment condition, so that the alignment accuracy and bonding efficiency can be improved based on the first alignment. Thus, the product reliability can be improved. Here, the adjustment of the relative position parameter may be realized by holding the first wafer and adjusting the second wafer, or by holding the second wafer and adjusting the first wafer, or by adjusting the first wafer and the second wafer simultaneously until the second alignment of the first alignment mark and the second alignment mark is achieved.

It should be noted that, in the implementations of the present disclosure, the first distance or the second distance may be selected as the relative position parameter, or the first distance and the second distance may be selected together as the relative position parameter. In this way, the error of the above-mentioned relative position parameter can be reduced by averaging multiple calculations. On one hand, the first direction and the second direction may be perpendicular to each other in a direction parallel to the first wafer and/or the second wafer, such as, the x direction and the y direction of the coordinate system. In this way, it is convenient to calculate the values of the first distance and the second distance to improve the accuracy of the calculation, so that the accuracy of the second alignment can be improved. On the other hand, the first distance threshold may be greater than the third distance threshold, and the second distance threshold may be greater than the fourth distance threshold, so that the first alignment may be a coarse alignment and the second alignment may be an accurate alignment. Thus, the alignment steps can be reduced, and the costs can be saved during the process of the first alignment, and the alignment accuracy, bonding efficiency, and product reliability can be improved during the process of the second alignment.

In some implementations, the first type of optical beam is red light, and the second type of optical beam is infrared light.

In the implementations of the present disclosure, according to the actual situation, the first type of optical beam may be absorbed by the wafers and reflected by the alignment marks. Here, the red light (with a band of 600 nm to 700 nm) may be selected. This is because the red light, as visible light, is uniform parallel light, and the wavelength of the red light is the longest compared with other visible light, so that the position of the alignment mark on the wafers can be observed more clearly. On the other hand, the cost of generating the red light is low, which can be used as the beam in the first alignment process to improve the efficiency of wafer bonding.

According to the actual situation, the second type of optical beam may pass through the wafers and be reflected by the alignment marks. Here the infrared light (with a band of 700 nm to 4000 nm) may be selected. This is because the wavelength of the infrared light is larger than that of the red light, and the infrared light has better penetration capability, which allows the infrared light to be used as a beam in the second alignment process to improve the accuracy of the alignment.

In summary, the wafer bonding method provided in the implementations of the present disclosure may use a first type of optical beam to perform first alignment of the first wafer and the second wafer, and use a second type of optical beam to perform second alignment of the first wafer and the second wafer after that the first wafer and the second wafer are moved to satisfy the bonding distance. In this way, the position error generated during wafer movement can be reduced; the wafer bonding accuracy can be improved, and the product reliability can be improved.

Figure 9:
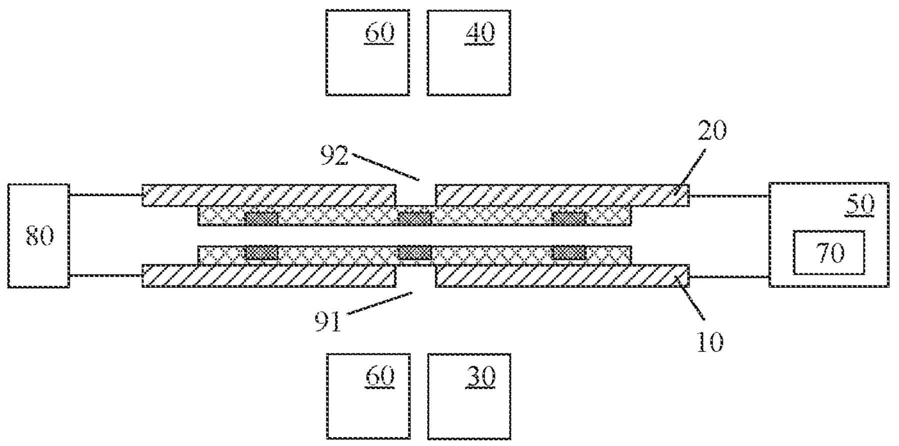
FIG. 9 is a structural diagram of a wafer bonding apparatus according to an implementation of the present disclosure.

As shown in FIG. 9, an implementation of the present disclosure further provides a wafer bonding apparatus, including a first bearing table 10, a second bearing table 20, a first alignment component 30, a second alignment component 40, a mobile component 50, a third alignment component 60, and a bonding component 80.

The first bearing table 10 is configured to hold a first wafer. Herein, the first wafer is provided with at least one first alignment mark.

The second bearing table 20 is opposite to the first bearing table, and configured to hold a second wafer. Herein, the second wafer is provided with at least one second alignment mark.

The first alignment component 30 is located on a side on which the first bearing table 10 bears the first wafer, and configured to determine a first position parameter of the first alignment mark on the first wafer by using a first type of optical beam.

The second alignment component 40 is located on a side where the second bearing table 20 bears the second wafer, and is configured to determine a second position parameter of the second alignment mark on the second wafer by using the first type of optical beam.

The mobile component 50 is connected to the bearing tables, and configured to move, according to the first position parameter and the second position parameter, the first wafer and the second wafer to be opposite to each other to achieve a first alignment of the first alignment mark and the second alignment mark.

The third alignment component 60 is located on a side of the first bearing table 10 and/or a side of the second bearing table 20, and configured to control the mobile component 50 to adjust, by using a second type of optical beam, a relative position between the first wafer and the second wafer to achieve a second alignment of the first alignment mark and the second alignment mark.

The bonding component 80 is connected to the first bearing table 10 and the second bearing table 20, and configured to bond the first wafer to the second wafer.

The bearing table in the implementations of the present disclosure may include, but is not limited to, a vacuum chuck, a chuck, a robot arm, or the like, and may be freely moved according to the requirements of an operator. Herein the types and the sizes of the first bearing table and the second bearing table may be the same or different. For example, the first bearing table may be a chuck that seizes and moves the first wafer freely, and the second bearing table may be a robot arm that holds and moves the second wafer freely. It should be noted that the first bearing table and the second bearing table are disposed opposite to each other during the process of the alignment and the bonding of the wafers, and the first bearing table may be disposed below the second bearing table or may be disposed above the second bearing table.

The first alignment component, the second alignment component, and the third alignment component of the implementations of the present disclosure may all include one or more of an optical source, an observation mirror, or other optical components that can be used for alignment, and may be optical components integrating optical sources and observation mirrors. The first alignment component and the second alignment component may be positioned on a side on which the bearing table bears the wafers or a reverse side thereof. The third alignment component may be positioned on a side on which the bearing table bears the wafers or an opposite side thereof, and include optical sources and observation mirrors respectively positioned on one side and the other side on which the bearing table bears the wafers. During the actual alignment, the spatial rectangular coordinate system may be established with the alignment components as the coordinate origins, so that the position parameters of the alignment marks on the wafer may be converted into the coordinate parameters, and the distance between the coordinates may be used to control the moving distance of the wafer. The implementation of the present disclosure includes a mobile component to connect the bearing tables to control the movement of the wafers such that alignment marks on the first wafer and the second wafer are aligned with each other and the projections on the corresponding coordinate systems at least partially coincide. For example, the first alignment component and the second alignment component in the implementations of the present disclosure may perform the first alignment by using a first type of optical beam, and the third alignment component may perform the second alignment by using a second type of optical beam.

In the implementations of the present disclosure, the mobile component may control the bearing table to perform the first alignment and move the first wafer and the second wafer to the position at which bonding is to be performed after the alignment. The mobile component may also adjust the bearing table to change the relative position parameter between the first alignment mark and the second alignment mark to perform the second alignment. After the second alignment, the bonding component may bond the first wafer and the second wafer satisfying the bonding conditions (located at the position to be bonded and aligned).

Thus, before the operation of bonding, the wafer bonding apparatus provided in the implementation of the present disclosure may perform the first alignment with the first type of optical beam by a first alignment component and a second alignment component, and perform the second alignment with the second type of optical beam. It should be noted that the first alignment is a process of moving the bonding surface of the first wafer and the bonding surface of the second wafer to opposing positions. The second alignment is a process of reducing the error of the relative position caused by the change of relative distance based on the fact that the bonding surface of the first wafer and the bonding surface of the second wafer are opposite to each other, and adjusting the first alignment reference point and the second alignment reference point to meet the alignment conditions again before the bonding operation. Thus, the position error caused during the movement of wafers can be reduced, so that the accuracy of wafer bonding and product reliability can be improved.

In some implementations, as shown in FIG. 9, the first bearing table 10 includes at least one first opening 91 at a position corresponding to the first alignment mark.

The second bearing table 20 includes at least one second opening 92 located at a position corresponding to the second alignment mark.

In the implementations of the present disclosure, the bearing table may be opaque. Therefore, at least one patterned opening may be provided on each of the first bearing table and the second bearing table so that the first type optical beam and the second type optical beam may irradiate the surface of the wafers through the openings. It should be noted that multiple openings may have the same pattern and size, and may be spaced at an equal interval. For example, during the first alignment, the first opening on the first bearing table and the second opening on the second bearing table may be located on the optical axis of the first type of optical beam, and during the second alignment, the first opening on the first bearing table and the second opening on the second bearing table may be located on the optical axis of the second type of optical beam. Thus, the position parameters of the corresponding alignment marks can be obtained more accurately through the alignment components.

Figure 10A:
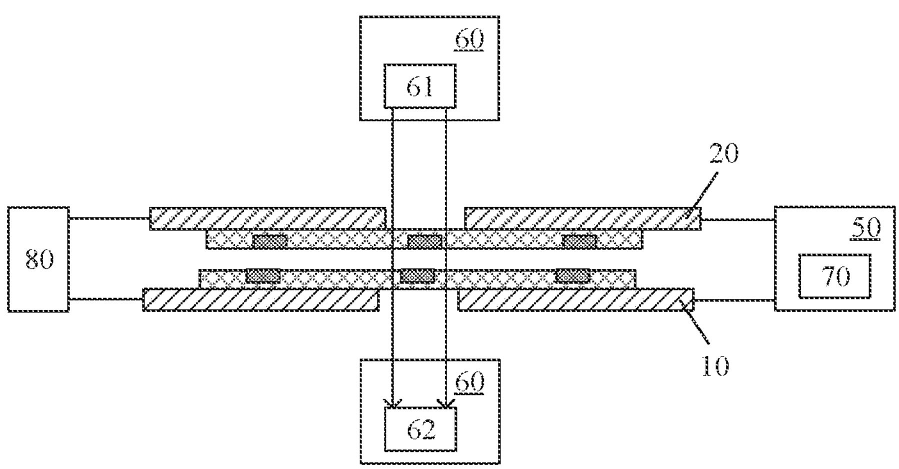
FIGS. 10A to 10C and FIGS. 11A to 11C are exemplary structural diagrams of a third alignment component according to an implementation of the present disclosure.

In some implementations, as shown in FIG. 10A, the third alignment component 60 includes a first light-emitting unit 61 and a first receiving unit 62.

The first light-emitting unit 61 is located on a side of the first bearing table 10 or a side of the second bearing table 20, and configured to emit the second type of optical beam. Herein, the second type of optical beam passes through the first wafer and the second wafer.

The first receiving unit 62 is located on the other side of the first bearing table 10 or the other side of the second bearing table 20, which is opposite to the side on which the first light-emitting unit 61 is located, and configured to receive the second type of optical beam passing through the first wafer and the second wafer.

In the implementations of the present disclosure, the third alignment component can be located on both sides of the bearing table or on one side; here the one side refers to the side away from the side on which the bearing table bears the wafers. It should be noted that the third alignment component may include a first light-emitting unit that emits a second type of optical beam, and a first receiving unit that receives the second type of optical beam. The second type of optical beam may be irradiated parallelly onto the wafer surface according to actual requirements. Therefore, the first light-emitting unit and the first receiving unit can be located on the optical path on which the opening is located.

For example, as shown in FIG. 10A, the first light-emitting unit and the first receiving unit may be positioned on two sides of the first and second bearing tables respectively. Thus, the second type of optical beam can be emitted by the first light-emitting unit, irradiate the surfaces of the first wafer and the second wafer through the opening, project the first alignment mark and the second alignment mark, pass through the opening and finally be received by the first receiving unit.

Figure 10B:
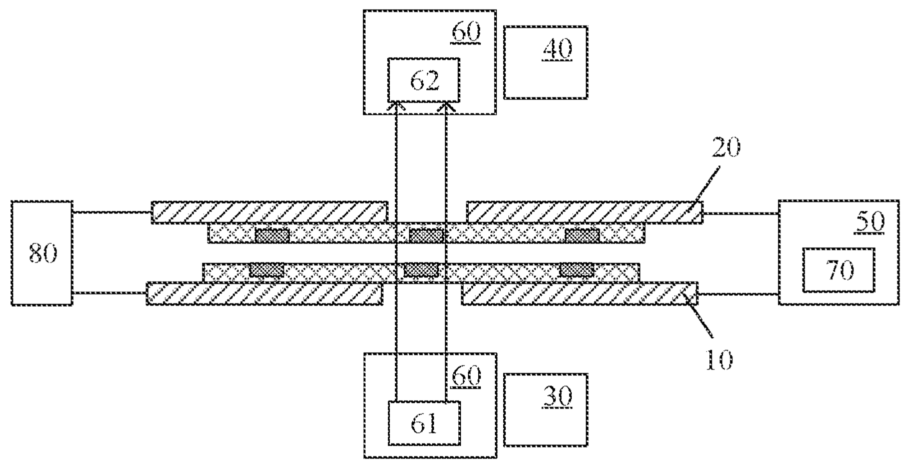
Figure 10C:
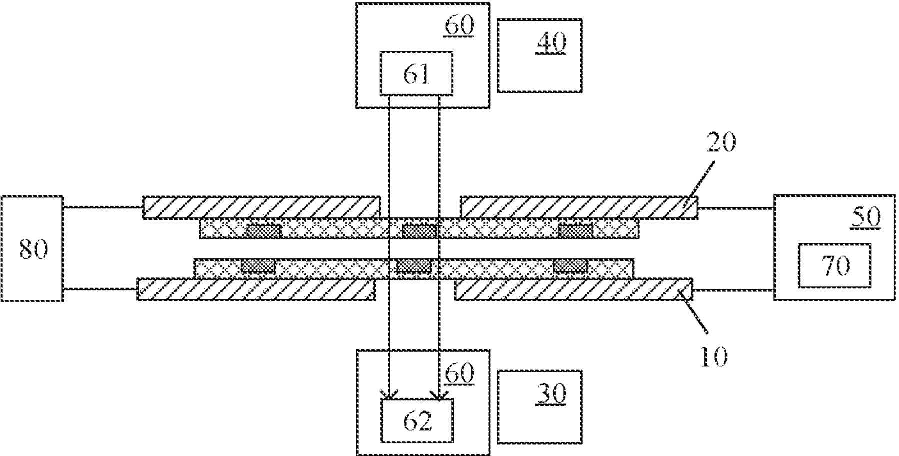

In some implementations, as shown in FIG. 10B, the first light-emitting unit 61 is located on the same side of the first bearing table 10 with the first alignment component 30, and the first receiving unit 62 is located on the same side of the second bearing table 20 with the second alignment component 40; or as shown in FIG. 10C, the first light-emitting unit 61 is located on the same side of the second bearing table 20 with the second alignment component 40, and the first receiving unit 62 is located on the same side of the first bearing table 10 with the first alignment component 30.

In the implementation of the present disclosure, the first alignment component is located on the side on which the first bearing table bears the first wafer, that is, the side away from the bearing surface of the second bearing table. The second alignment component is located on the side on which the second bearing table bears the second wafer, that is, the side away from the bearing surface of the first bearing table. Therefore, the first light-emitting unit and the first receiving unit in the implementation of the present disclosure may be placed on different sides of the first alignment component according to actual requirements, so that the transmission image of the second type optical beam on the first wafer and the second wafer can be acquired.

Figure 11A:
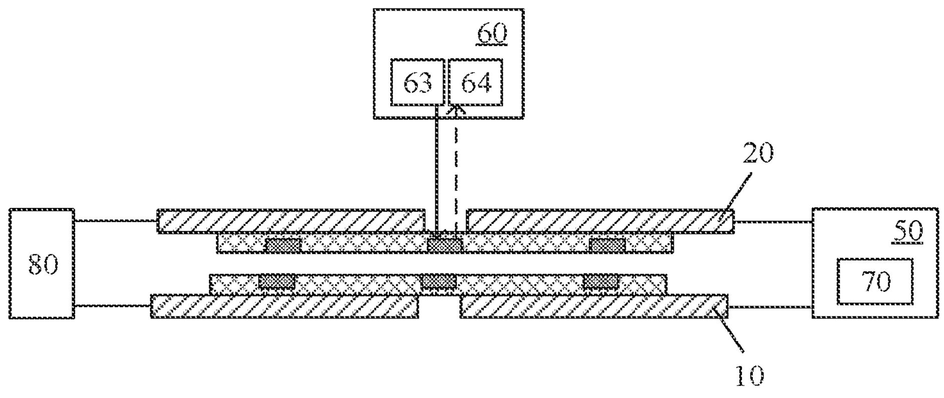

In some implementations, as shown in FIG. 11A, the third alignment component 60 includes a second light-emitting unit 63 and a second receiving unit 64.

The second light-emitting unit 63 is located on a side of the first bearing table 10 or a side of the second bearing table 20, and is configured to emit the second type of optical beam. Herein, the second type of optical beam is reflected on the first wafer and the second wafer.

The second receiving unit 64 is located on the same side of the second bearing table 20 with the second light-emitting unit 63, and is configured to receive the second type of optical beam reflected on the first wafer and the second wafer.

In the implementation of the present disclosure, the third alignment component may further include a second light-emitting unit that emits a second type of optical beam, and a second receiving unit that receives the second type of optical beam. Similarly, the first light-emitting unit and the first receiving unit may be provided on the optical path where the above-mentioned opening is located according to actual requirements. For example, as shown in FIG. 11A, the second light-emitting unit and the second receiving unit may be located on a same side of the bearing table, so that the second optical beam can be emitted by the second light-emitting unit, irradiate the surfaces of the first wafer and the second wafer through the opening, be reflected at the first alignment mark and the second alignment mark to generate the reflection image, pass through the opening and finally be received by the second receiving unit.

Figure 11B:
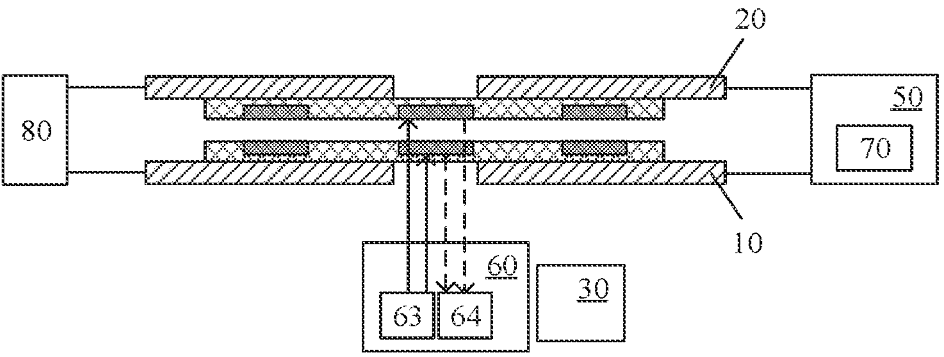
Figure 11C:
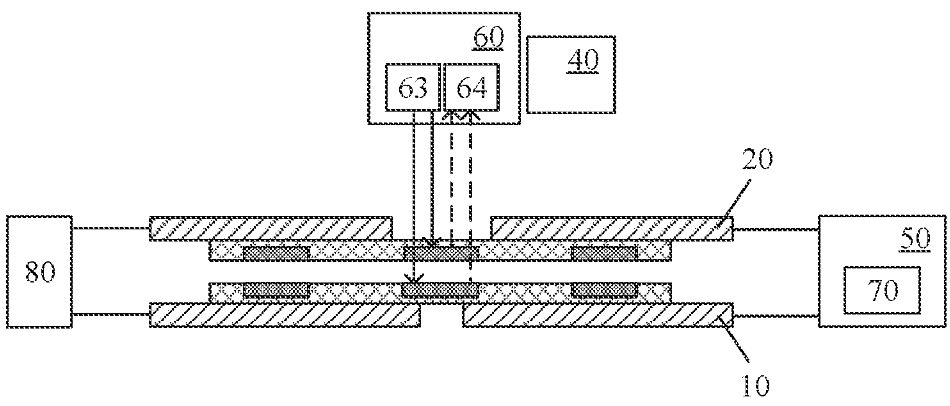

In some implementations, as shown in FIG. 11B, the second light-emitting unit 63 and the second receiving unit 64 are located on the same side of the first bearing table 10 with the first alignment component 30; or As shown in FIG. 11C, the second light-emitting unit 63 and the second receiving unit 64 are located on the same side of the second bearing table 20 with the second alignment component 40.

Figure 11D:
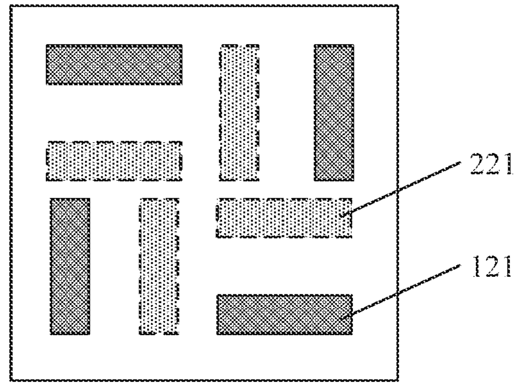
FIG. 11D is an exemplary structural diagram of a reflection image in an observation mirror according to an implementation of the present disclosure.

In the implementation of the present disclosure, the second light-emitting unit and the second receiving unit may also be positioned on a same side of the first bearing table 10 with the first alignment component or a same side of the second bearing table 20 with the second alignment component according to actual requirements, so that the reflection image of the second type of optical beam at the first wafer and the second wafer can be acquired. It should be noted that the above-mentioned first alignment mark and second alignment mark may include a light transmitting portion and an opaque portion, and the reflection image obtained in the second receiving unit may be shown in FIG. 11D. The first alignment mark may have multiple opaque patterns 121 and the second alignment mark may have multiple opaque patterns 221. A portion other than the opaque pattern is a light transmitting portion. For example, if the second alignment mark is closer to the above-mentioned optical source and observation mirror than the first alignment mark, a portion of the second type of optical beam emitted by the second light-emitting unit will irradiate the opaque portion of the second alignment mark and be reflected back to the second receiving unit; another portion will irradiate the light-transmitting portion of the second alignment mark, pass through the second wafer, irradiate the opaque portion of the first alignment mark and be reflected back to the second receiving unit. Thus, the reflection image of the first alignment mark and the second alignment mark can be acquired in the observation mirror.

Figure 12:
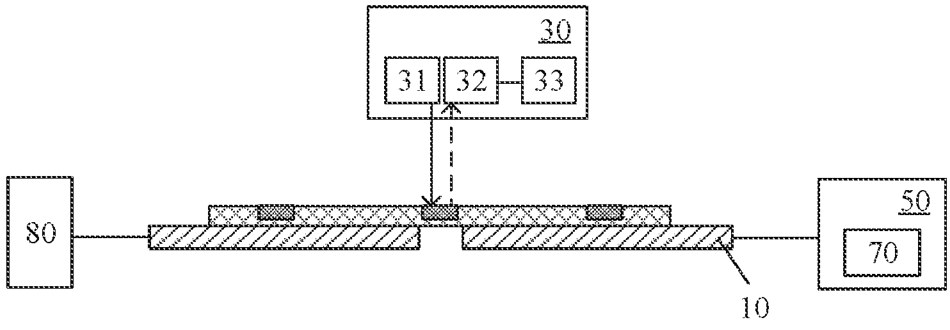
FIG. 12 is an exemplary structural diagram of a first alignment component according to an implementation of the present disclosure.

In some implementations, as shown in FIG. 12, the first alignment component 30 includes a third light-emitting unit 31, a third receiving unit 32, and a first processing unit 33.

The third light-emitting unit 31 is located on one side on which the first bearing table 10 bears the first wafer, and is configured to emit the first type of optical beam and irradiate the first wafer.

The third receiving unit 32 is located on one side on which the first bearing table 10 bears the first wafer, and is configured to acquire the first reflection image formed by the reflection of the first type of optical beam at the first alignment mark.

The first processing unit 33 is connected to the third receiving unit 32, and configured to determine, according to the first reflection image, the first position parameter.

In the implementation of the present disclosure, the third light-emitting unit and the third receiving unit included in the first alignment component may be located on the side on which the first bearing table bears the first wafer. For example, the first bearing table is located in the horizontal direction, and the first wafer is located on the upper surface of the first bearing table. Thus, the first type of optical beam emitted by the third light-emitting unit can irradiate the first wafer and be reflected by the first alignment mark, and then the first reflection image is obtained by the third receiving unit.

Furthermore, the coordinate operation of the first reflected image can be obtained by the first processing unit connected to the third receiving unit, so as to determine the first position parameter of the first alignment mark. Herein, the coordinate parameter is the coordinate parameter in the coordinate system established with the first alignment component as the coordinate origin.

Figure 13:
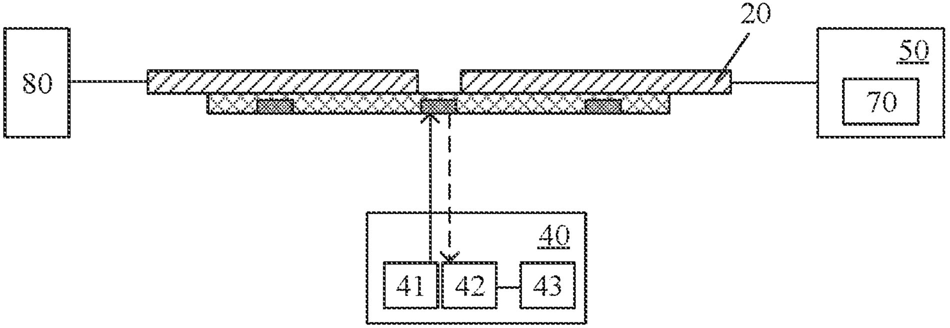
FIG. 13 is an exemplary structural diagram of a second alignment component according to an implementation of the present disclosure.

In some implementations, as shown in FIG. 13, the second alignment component 40 includes a fourth light-emitting unit 41, a fourth receiving unit 42, and a second processing unit 43.

The fourth light-emitting unit 41 is located on a side on which the second bearing table 20 bears the second wafer, and is configured to emit the first type of optical beam and irradiate the second wafer.

The fourth receiving unit 42 is located on a side on which the second bearing table 20 bears the second wafer, and is configured to acquire a second reflection image formed by the reflection of the first type of optical beam at the second alignment mark.

The second processing unit 43 is connected to the fourth receiving unit 42, and configured to determine, according to the second reflection image, the second position parameter.

In the implementation of the present disclosure, the fourth light-emitting unit and the fourth receiving unit included in the second alignment component may be located on the side on which the second bearing table bears the second wafer. For example, the second bearing table is located in the horizontal direction, and the second wafer is located on the lower surface of the second bearing table. Thus, the bonding surface of the first wafer and the bonding surface of the second wafer are opposite to each other, and the first-type optical beam emitted by the fourth light-emitting unit can be irradiated onto the second wafer and reflected by the second alignment mark, and then the second reflection image is obtained by the fourth receiving unit.

Furthermore, the coordinate operation of the second reflected image can be obtained by the second processing unit connected to the fourth receiving unit, so as to determine the second position parameter of the second alignment mark. Herein, the coordinate parameter is the coordinate parameter in the coordinate system established with the second alignment component as the coordinate origin.

It should be noted that the features disclosed in the several method or apparatus implementations of the present disclosure may be combined arbitrarily without conflict to obtain a new method or apparatus implementation.

The foregoing descriptions are merely exemplary implementations of the present disclosure, and the scope of protection of the present disclosure is not limited thereto. Any change or replacement readily contemplated by a person skilled in the art within the technical scope disclosed in the present disclosure shall fall within the scope of protection of the present disclosure. Accordingly, the scope of protection of the present disclosure shall be subject to the scope of protection of the claims.

The invention claimed is:

1. A wafer bonding method, comprising:

determining a first position parameter of a first alignment mark on a first wafer using a first type of optical beam, the first type of optical beam being absorbed by a region of the first wafer other than the first alignment mark;

determining a second position parameter of a second alignment mark on a second wafer using the first type of optical beam, the first type of optical beam being absorbed by a region of the second wafer other than the second alignment mark;

performing a first alignment, comprising: moving the first wafer and the second wafer to be opposite to each other by changing a relative position between the first wafer and the second wafer according to the first position parameter and the second position parameter, to align the first alignment mark with the second alignment mark;

before bonding the first wafer to the second wafer, performing a second alignment at a predetermined bonding distance, in a vertical direction, between the first wafer and the second wafer, comprising:

while maintaining the first wafer and the second wafer at the predetermined bonding distance in the vertical direction, adjusting, using a second type of optical beam, the relative position between the first wafer and the second wafer, in a plane normal to the vertical direction, to align the first alignment mark with the second alignment mark, wherein a wavelength of the second type of optical beam is larger than a wavelength of the first type of optical beam, and the second type of optical beam has better penetration capability than the first type of optical beam to pass through at least one of the first wafer or the second wafer for performing the second alignment, the first type of optical beam being non-transmissive through the first wafer and the second wafer; and based on the second alignment using the second type of optical beam, bonding the first wafer to the second wafer.

2. The wafer bonding method of claim 1, wherein before performing the second alignment, the wafer bonding method further comprises:

adjusting a relative distance, in the vertical direction, between the first wafer and the second wafer until the relative distance satisfies the predetermined bonding distance.

3. The wafer bonding method of claim 2, wherein adjusting the relative distance between the first wafer and the second wafer until the relative distance satisfies the predetermined bonding distance comprises:

adjusting at least a position of the first wafer or a position of the second wafer in a direction perpendicular to at least one of the first wafer or the second wafer, until the relative distance between the first wafer and the second wafer satisfies the predetermined bonding distance.

4. The wafer bonding method of claim 1, wherein performing the second alignment comprises:

determining a relative position parameter between the first alignment mark and the second alignment mark using the second type of optical beam; and adjusting, according to the relative position parameter, the relative position between the first wafer and the second wafer to align the first alignment mark with the second alignment mark.

5. The wafer bonding method of claim 4, wherein:

the relative position parameter comprises a relative position parameter between the first alignment mark and the second alignment mark in a direction parallel to at least one of the first wafer or the second wafer; and performing the second alignment comprises:

adjusting, according to the relative position parameter, at least a position of the first wafer or a position of the second wafer in the direction parallel to the at least one of the first wafer or the second wafer to align the first alignment mark with the second alignment mark.

6. The wafer bonding method of claim 1, wherein performing the second alignment comprises:

adjusting at least a position of the first wafer or a position of the second wafer in a direction perpendicular to at least one of the first wafer or the second wafer; and synchronously adjusting, using the second type of optical beam, at least the position of the first wafer or the position of the second wafer in a direction parallel to at least one of the first wafer or the second wafer, to align the first alignment mark with the second alignment mark and make a relative distance between the first wafer and the second wafer satisfy the predetermined bonding distance.

7. The wafer bonding method of claim 1, wherein performing the second alignment comprises:

irradiating the relative position between the first alignment mark and the second alignment mark with the second type of optical beam;

acquiring a first transmission image of the first alignment mark and the second alignment mark on a side on which the second type of optical beam emerges from the first wafer and the second wafer; and adjusting, according to the first transmission image, the relative position between the first wafer and the second wafer to align the first alignment mark with the second alignment mark.

8. The wafer bonding method of claim 7, wherein the first transmission image comprises:

a first projection image of the first alignment mark and a second projection image of the second alignment mark.

9. The wafer bonding method of claim 1, wherein performing the second alignment comprises:

irradiating the relative position between the first alignment mark and the second alignment mark using the second type of optical beam;

acquiring a first reflection image formed by reflection of the first alignment mark and the second alignment mark on a side on which the second type of optical beam irradiates the first wafer; and adjusting, according to the first reflection image, the relative position between the first wafer and the second wafer to align the first alignment mark with the second alignment mark.

10. The wafer bonding method of claim 9, wherein the first reflection image comprises:

a third projection image of the first alignment mark and a fourth projection image of the second alignment mark.

11. The wafer bonding method of claim 1, wherein the first alignment mark comprises a first alignment reference point, and the second alignment mark comprises a second alignment reference point;

wherein performing the first alignment comprises at least one of the following:

making a first distance between the first alignment reference point and the second alignment reference point in a first direction less than or equal to a first distance threshold; or making a second distance between the first alignment reference point and the second alignment reference point in a second direction less than or equal to a second distance threshold;

wherein performing the second alignment comprises at least one of the following:

making a third distance between the first alignment reference point and the second alignment reference point in the first direction less than or equal to a third distance threshold; or making a fourth distance between the first alignment reference point and the second alignment reference point in the second direction less than or equal to a fourth distance threshold;

wherein the first direction and the second direction are perpendicular to each other in a direction parallel to at least one of the first wafer or the second wafer; and the first distance threshold is greater than the third distance threshold, and the second distance threshold is greater than the fourth distance threshold.

12. The wafer bonding method of claim 1, wherein determining the first position parameter of the first alignment mark on the first wafer using the first type of optical beam comprises:

irradiating the first wafer using the first type of optical beam;

acquiring a second reflection image formed by reflection of the first type of optical beam at the first alignment mark; and determining the first position parameter according to the second reflection image.

13. The wafer bonding method of claim 1, wherein determining the second position parameter of the second alignment mark on the second wafer using the first type of optical beam comprises:

irradiating the second wafer using the first type of optical beam;

acquiring a third reflection image formed by reflection of the first type of optical beam at the second alignment mark; and determining the second position parameter according to the third reflection image.

14. The wafer bonding method of claim 1, wherein the first position parameter is a coordinate parameter of the first wafer relative to a predetermined first coordinate system; and the second position parameter is a coordinate parameter of the second wafer relative to a predetermined second coordinate system.

15. The wafer bonding method of claim 1, wherein the first type of optical beam is red light, and the second type of optical beam is infrared light.

16. A wafer bonding apparatus, comprising:

a first bearing table, configured to hold a first wafer, wherein the first wafer is provided with at least one first alignment mark;

a second bearing table, opposite to the first bearing table, and configured to hold a second wafer, wherein the second wafer is provided with at least one second alignment mark;

a first alignment component, located on a side on which the first bearing table bears the first wafer, and configured to determine a first position parameter of the first alignment mark on the first wafer using a first type of optical beam, the first type of optical beam being absorbed by a region of the first wafer other than the first alignment mark;

a second alignment component, located on a side where the second bearing table bears the second wafer, and configured to determine a second position parameter of the second alignment mark on the second wafer using the first type of optical beam, the first type of optical beam being absorbed by a region of the second wafer other than the second alignment mark;

a mobile component, connected to the first bearing table and the second bearing table, and configured to perform a first alignment, comprising: moving the first wafer and the second wafer to be opposite to each other by changing a relative position between the first wafer and the second wafer according to the first position parameter and the second position parameter, to align the first alignment mark with the second alignment mark;

a third alignment component, located on at least a side of the first bearing table or a side of the second bearing table, and configured to, before bonding the first wafer to the second wafer, control the mobile component to perform a second alignment at a predetermined bonding distance, in a vertical direction, between the first wafer and the second wafer, comprising:

while maintaining the first wafer and the second wafer at the predetermined bonding distance in the vertical direction, adjusting, using a second type of optical beam, the relative position between the first wafer and the second wafer, in a plane normal to the vertical direction, to align the first alignment mark with the second alignment mark, wherein a wavelength of the second type of optical beam is larger than a wavelength of the first type of optical beam, and the second type of optical beam has better penetration capability than the first type of optical beam to pass through at least one of the first wafer or the second wafer for performing the second alignment, the first type of optical beam being non-transmissive through the first wafer and the second wafer; and a bonding component, connected to the first bearing table and the second bearing table, and configured to, based on the second alignment using the second type of optical beam, bond the first wafer to the second wafer.

17. The wafer bonding apparatus of claim 16, wherein the first bearing table comprises at least one first opening at a position corresponding to the first alignment mark; and the second bearing table comprises at least one second opening at a position corresponding to the second alignment mark.

18. The wafer bonding apparatus of claim 16, wherein the third alignment component comprises:

a first light-emitting unit, located on a side of the first bearing table or a side of the second bearing table, and configured to emit the second type of optical beam, wherein the second type of optical beam passes through the first wafer and the second wafer; and a first receiving unit, located on another side of the first bearing table or another side of the second bearing table, which is opposite to the side on which the first light-emitting unit is located, and configured to receive the second type of optical beam passing through the first wafer and the second wafer.

19. The wafer bonding apparatus of claim 18, wherein the first light-emitting unit is located on a same side of the first bearing table as the first alignment component, and the first receiving unit is located on a same side of the second bearing table as the second alignment component; or the first light-emitting unit is located on the same side of the second bearing table as the second alignment component, and the first receiving unit is located on the same side of the first bearing table as the first alignment component.

20. The wafer bonding apparatus of claim 16, wherein the third alignment component comprises:

a second light-emitting unit, located on a side of the first bearing table or a side of the second bearing table, and configured to emit the second type of optical beam, wherein the second type of optical beam is reflected on the first wafer and the second wafer; and a second receiving unit, located on a same side of the first bearing table or a same side of the second bearing table as the second light-emitting unit, and configured to receive the second type of optical beam reflected on the first wafer and the second wafer.

* * * * *